United States Patent
Kimelman et al.

(10) Patent No.: US 7,278,073 B2
(45) Date of Patent: Oct. 2, 2007

(54) DIAGNOSTIC DATA CAPTURE WITHIN AN INTEGRATED CIRCUIT

(75) Inventors: Paul Kimelman, Alamo, CA (US); Ian Field, Walnut Creek, CA (US)

(73) Assignee: ARM Limited, Cambridge (GB)

( * ) Notice: Subject to any disclaimer, the term of this patent is extended or adjusted under 35 U.S.C. 154(b) by 460 days.

(21) Appl. No.: 10/417,329

(22) Filed: Apr. 17, 2003

(65) Prior Publication Data

US 2004/0210804 A1  Oct. 21, 2004

(51) Int. Cl.
*G01R 31/28* (2006.01)
(52) U.S. Cl. .................................. 714/724
(58) Field of Classification Search ............... 714/724
See application file for complete search history.

(56) References Cited

U.S. PATENT DOCUMENTS

| | | | |
|---|---|---|---|
| 5,488,688 A | | 1/1996 | Gonzales et al. |
| 5,771,240 A | * | 6/1998 | Tobin et al. ............... 714/724 |
| 6,075,941 A | | 6/2000 | Itoh et al. |
| 6,820,051 B1 | * | 11/2004 | Swoboda ................ 703/28 |
| 6,954,878 B2 | * | 10/2005 | Kudo ........................ 714/30 |
| 7,099,818 B1 | * | 8/2006 | Nemecek et al. ........... 703/28 |

FOREIGN PATENT DOCUMENTS

| | | |
|---|---|---|
| EP | 0 862 115 | 9/1998 |
| EP | 0 897 151 | 2/1999 |
| EP | 1 089 187 | 4/2001 |
| JP | 07-230432 | 8/1995 |
| JP | 08-292898 | 11/1996 |
| JP | 10-214201 | 8/1998 |

* cited by examiner

*Primary Examiner*—James C Kerveros
(74) *Attorney, Agent, or Firm*—Nixon & Vanderhye P.C.

(57) ABSTRACT

An integrated circuit is provided with a diagnostic data capture and output system in the form of a diagnostic data capture circuit which captures a data word and a context word from a bus. The bus may be the functional bus connecting functional circuits within the integrated circuit or a dedicated bus linking one or more functional circuits directly to the diagnostic data capture circuit. The diagnostic data captured is buffered within a first-in-first-out buffer and then serialised for output. The diagnostic data fields also include a time value indicative of the time at which the diagnostic data field concerned was captured and whether any diagnostic data fields have failed to be captured.

50 Claims, 4 Drawing Sheets

DIAGNOSTIC DATA CAPTURE WITHIN AN INTEGRATED CIRCUIT

BACKGROUND OF THE INVENTION

1. Field of the Invention

This invention relates to the field of integrated circuits. More particularly, this invention relates to the capture of diagnostic data within integrated circuits, such as, for example, as is used in debugging, performance monitoring, design and other processes.

2. Description of the Prior Art

It is known to provide integrated circuits with built in systems which capture and then output diagnostic data. An example of such integrated circuits are those produced by ARM Limited of Cambridge, England which include the embedded trace macrocell (ETM). The ETM system operates to capture trace data, such as data identifying program instructions executed, data values manipulated etc, into an on-chip trace buffer for later output to an external diagnostic device. A problem with the ETM-type systems is that they consume a relatively large amount of circuit resource. The circuit area devoted to this diagnostic use does not have a substantial use in production integrated circuits once the design and development work which utilise the ETM circuits has been completed.

It is also known to insert within program code in development systems program instructions which are intended to output diagnostic data from the integrated circuit, using a UART or other comms resource. A disadvantage with this program driven approach is that it imposes a significant load on the program concerned and can distort its operation in a way which makes the diagnostic data less useful. This is a particular problem because the device interfaces are not designed for direct access. Worse, if the comms device is full (cannot take more data), the application may get stalled or data lost without record. Conversely, if the elements of the program code are made of a sufficiently low priority and sufficiently infrequently activate that they do not impact performance, then the amount of information that can be recovered is limited and the timing of that information may also be disadvantageously delayed.

SUMMARY OF THE INVENTION

Viewed from one aspect the present invention provides an integrated circuit, said integrated circuit comprising:

one or more functional circuits operable to perform data processing operations;

a diagnostic data capture circuit operable to capture from a bus a diagnostic data field of values comprising a data word generated by said one or more functional circuits and a context word representing a context of said one or more functional circuits associated with said data word; and a diagnostic data serial output circuit operable to serialise said diagnostic data field and output said diagnostic data field from said integrated circuit to an external diagnostic device.

The present technique provides a diagnostic data capture circuit which captures diagnostic data from a bus. This is a hardware capture mechanism which accordingly does not in itself place a processing load upon any executing program code. The diagnostic data field captured from the bus includes a data word and a context word. Arranging the diagnostic data capture circuit to also capture the context word allows the captured data word to be more readily interpreted and removes the need for program code or other mechanisms to provide context informing information for the interpretation of the diagnostic data. Once captured by the diagnostic data capture circuit, the diagnostic data field can be output by its own diagnostic data serial output circuit from the integrated circuit in a way which again does not impose a load elsewhere. The present technique provides a diagnostic data output capability with an advantageously low level of intrusion upon other elements of the integrated circuit whilst also requiring an advantageously low level of circuit overhead in itself.

It will be appreciated that the bus from which the diagnostic data capture circuit captures the diagnostic field could take a variety of different forms, but it is convenient in preferred embodiments that the diagnostic data capture circuit should capture diagnostic data from a functional bus of the integrated circuit linking two or more functional circuits.

In the context of the functional bus, the data word can be captured from a data portion of that functional bus and the context word can be captured from an address portion of the functional bus. It may be that the whole of the address on the functional bus may be used as the context word, but in preferred embodiments only a part of the address need be used to provide a sufficient degree of context information whilst reducing the amount of data which needs to be output from the integrated circuit.

As an alternative or in addition to the capture of diagnostic data from a functional bus, it is also possible to use a dedicated diagnostic bus directly passing data from one or more functional circuits to the diagnostic data capture circuit. In this context, there is an improved degree of flexibility in the nature of the data word and context word which can be captured since these are not constrained by a functional bus protocol.

Whilst the serial output of the diagnostic data could be direct and unbuffered, in preferred embodiments of the invention a first-in-first-out buffer is provided into which the diagnostic data fields are stored before being serialised and output. Such a first-in-first-out buffer provides a degree of resistance to overflowing the diagnostic data output capabilities. It may be the case that diagnostic events of interest occur at closely spaced times and without some degree of buffering these could not be simultaneously investigated.

In preferred embodiments of the invention the diagnostic data field includes a timing word indicative of a time value associated with the data word. The time value could have a variety of different forms, for example it is possible that it could be some form of cycle count or real-time value, but in preferred embodiments the amount of data required to be output from the integrated circuit can be reduced whilst still allowing a sufficient degree of time resolution by arranging that the count value is indicative of a time duration since capture of any previously captured diagnostic data field that is still being output by the diagnostic data serial output circuit.

In preferred embodiments the time value can also be used to indicate if one or more diagnostic data fields have failed to be captured, e.g. as a result of an overflow of diagnostic data fields or some other type of capture failure.

The output of the diagnostic data in serial form may be achieved in a variety of different ways and using a variety of different encodings. As an example, it could be that the diagnostic data field is split up into smaller multi-byte segments which are then output in a sequence. However, in preferred embodiments the overhead in the form of the external pin count associated with the diagnostic system is reduced by using a single serial data output line or a single serial data output line associated with a clock signal which may be generated by the integrated circuit itself or by another circuit and used with the integrated circuit. The output in combination with a clock signal generally allows a faster data transfer rate at the cost of an extra signal line or at least an additional degree of complexity in the case that the clock signal line concerned is already present as an external output.

A particularly preferred feature of the current technique is that a program instruction executing on one of the functional circuits can generate a diagnostic data field. Thus, a program may be seeded/instrumented with program instructions which generate diagnostic data at appropriate execution points. This allows considerable flexibility and power in the way that the diagnostic data is generated and what it may represent. Furthermore, the hardware diagnostic data capture circuit and serial output circuit have the effect that the program code need not be responsible for capture or output of the diagnostic data, merely its generation. This advantageously reduces the overhead on the program code. Further, the data will still be captured even if the program "crashes" after generation of this data.

The program instruction generating diagnostic data preferably does this by generating a bus transaction to a bus from which the data word and the context word are then captured. Program instructions which generate bus transactions are normally present within integrated circuits using bus structures and accordingly may be readily utilised for this diagnostic function.

A strongly preferred feature of the present technique is that the diagnostic data capture circuit is operable to capture bus transactions associated with an address matching a predetermined address characteristic. In this way, the diagnostic data capture circuit can be made a bus slave which has its own associated address range and the functional circuits arranged to generate bus transactions utilising addresses within that address range should they desire to generate diagnostic data for capture and output.

The use of a range of addresses associated with the diagnostic data capture circuit provides the strongly advantageous feature that the context word to be associated with the data word can be derived from the particular address within the range of addresses to which the bus transaction is directed. Thus, the functional circuit may provide its context information to be associated with the data field by arranging the bus transaction to be directed at a particular address location, this being particularly easy to achieve when the diagnostic data is generated by program instructions.

The context word can effectively be a representation of the address of the bus transaction by using an index value indicative of a position of the address used within the predetermined range of addresses.

Preferred embodiments of the invention provide programmable sensitivity to diagnostic events, which may be incorporated into the operation of the system in a way which cannot otherwise readily be adjusted by the user through use of a programmable mask value applied to the diagnostic data fields. This programmable mask value is used by the diagnostic data capture circuit to mask out diagnostic data which a user has determined is not of interest at that time or mask in data which is of interest.

Viewed from another aspect the present invention provides a diagnostic device for receiving diagnostic data from an integrated circuit, said diagnostic device comprising:

a diagnostic data serial data receiver operable to receive serial data representing a diagnostic field of values captured from a bus within said integrated circuit; and a diagnostic data decoder operable to decode said diagnostic field to identify therein a data word generated by one or more functional circuits within said integrated circuit and a context word representing a context of said one or more functional circuits associated with said data word.

Viewed from a further aspect the present invention provides a method of generating diagnostic data representative of one or more data processing operations performed by one or more functional circuits of an integrated circuit, said method comprising:

capturing from a bus a diagnostic data field of values comprising a data word generated by said one or more functional circuits and a context word representing a context of said one or more functional circuits associated with said data word; and serialising said diagnostic data field; and outputting said diagnostic data field from said integrated circuit to an external diagnostic device.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
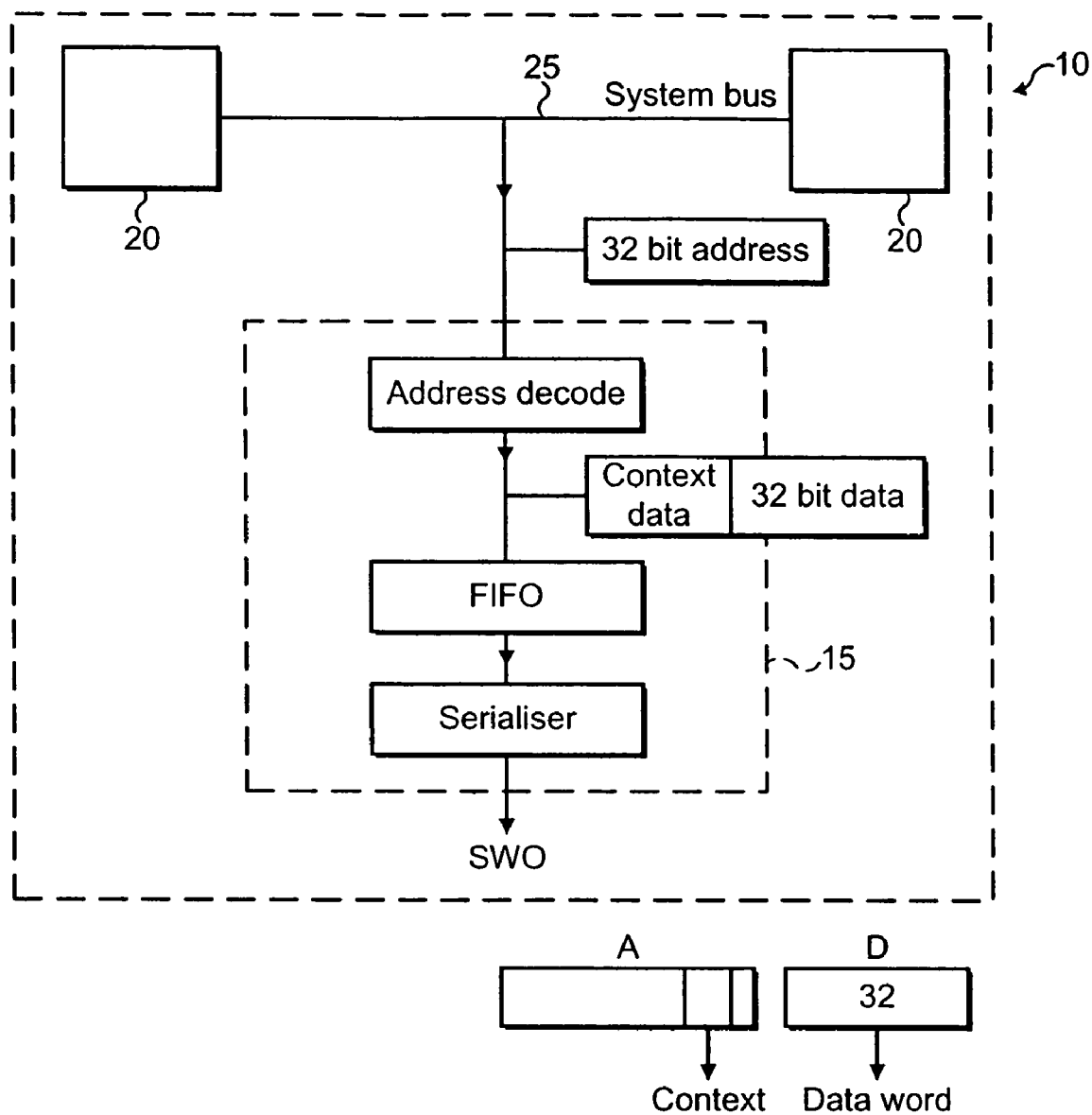
FIG. 1 schematically illustrates an integrated circuit comprising a diagnostic data capture circuit according to an embodiment of the present invention.

With reference to FIG. 1, an integrated circuit 10 is shown comprising a diagnostic data capture circuit 15 operable to capture diagnostic data travelling on a system bus 25 connecting two functional circuits 20. The diagnostic data capture circuit 15 provides an interface between data being processed by a data processing system and a single wire output and is sometimes referred to as a single wire output (SWO) device.

In the device of FIG. 1 the diagnostic data capture circuit is arranged to access data travelling along the bus between the functional circuits. It is essentially a passive device that apart from providing access to the data does not otherwise impact the system or affect the data in any way.

The diagnostic data capture device comprises an address decoder a FIFO and a serialiser. The diagnostic data capture device is operable to access data words travelling along a data portion of the bus and also to access an address that the data is to be written to that is travelling along an address portion of the bus. The data words intercepted are data writes as it is these that are of interest for diagnostic purposes. Having accessed the data word, the address decoder then processes it by adding selected bits of "context data" to the data word. This context data is derived from the address data and in effect serves to put the data word in context. An extended length data word is then passed to the FIFO.

In most embodiments the data word accessed is a 32-bit word and in preferred embodiments it is chosen to add 5 bits of context data to this. The context data is usually a portion of an address taken from the address data on the address bus.

Data capture can be triggered in a number of ways, including in response to data being written to particular addresses. Generally, in data processing systems diagnostic data is written to a particular area in the address space of the processor, and thus any data write to this particular area will be of interest to the diagnostic capture device. The system can therefore be set up so that a data write instruction to an address in this area will trigger the data capture device. One way of doing this is to provide the diagnostic data capture circuit with a mask circuit operable to use a programmable mask value to select diagnostic data fields to be captured.

Once the data capture circuit has been triggered, the address decoder acts to add context data to the data word. In many embodiments the individual addresses within the data area are specific to particular functions, and thus details of the individual address, which can be added to the data word as 5 bits of context data, provide information as to the particular function of the intercepted data word. In some embodiments the context field can therefore be an offset value indicative of a position of the address within the predetermined range of addresses. In this regard, in a typical model of an RTOS for example, index 0 could be used for thread-in, 1 for thread-out, 2 for mutex pend, 3 for queue pend, etc. This means, for example, that the RTOS only writes the thread ID (TCB address or other 32-bit info) into index 0 to indicate that the specified thread was dispatched in. So, in one store instruction, the RTOS can convey both what action/event occurred and the context of that action/event.

The 37-bit data output from the address decoder is then output to a FIFO, which may only be a one stage FIFO, but preferably contains several stages. In effect the FIFO allows multiple words of data to be sent close together, as long as the overall rate is below the bandwidth. A typical depth of the FIFO is three, although different depths may be chosen depending on the maximum rate of the functional circuits, the clock rate of the core receiving the data and the output rate of the SWO.

A serialiser then serves to output the data output from the FIFO as serial data via a single wire output (SWO). The data rate output by the serialiser depends on the embodiment. There is a low-speed and high-speed embodiment and these are described in more detail below. Essentially the high-speed embodiment requires the serialiser output to be clocked (see FIG. 2) and thus, in addition to the single diagnostic data serial output (SWO) there is a clock signal input line. Generally the high speed embodiment works at around 48 MHz, although it can support 100 MHz.

The low speed embodiment does not require the clock input and can sustain up to 12 MHz on the single pin interface.

The single wire output interface device, will output a plurality of these 37-bit data words in series, and any receiving device can then use the 5-bit context data associated with the 32-bit data word to de-multiplex the output data into different streams.

Figure 2:
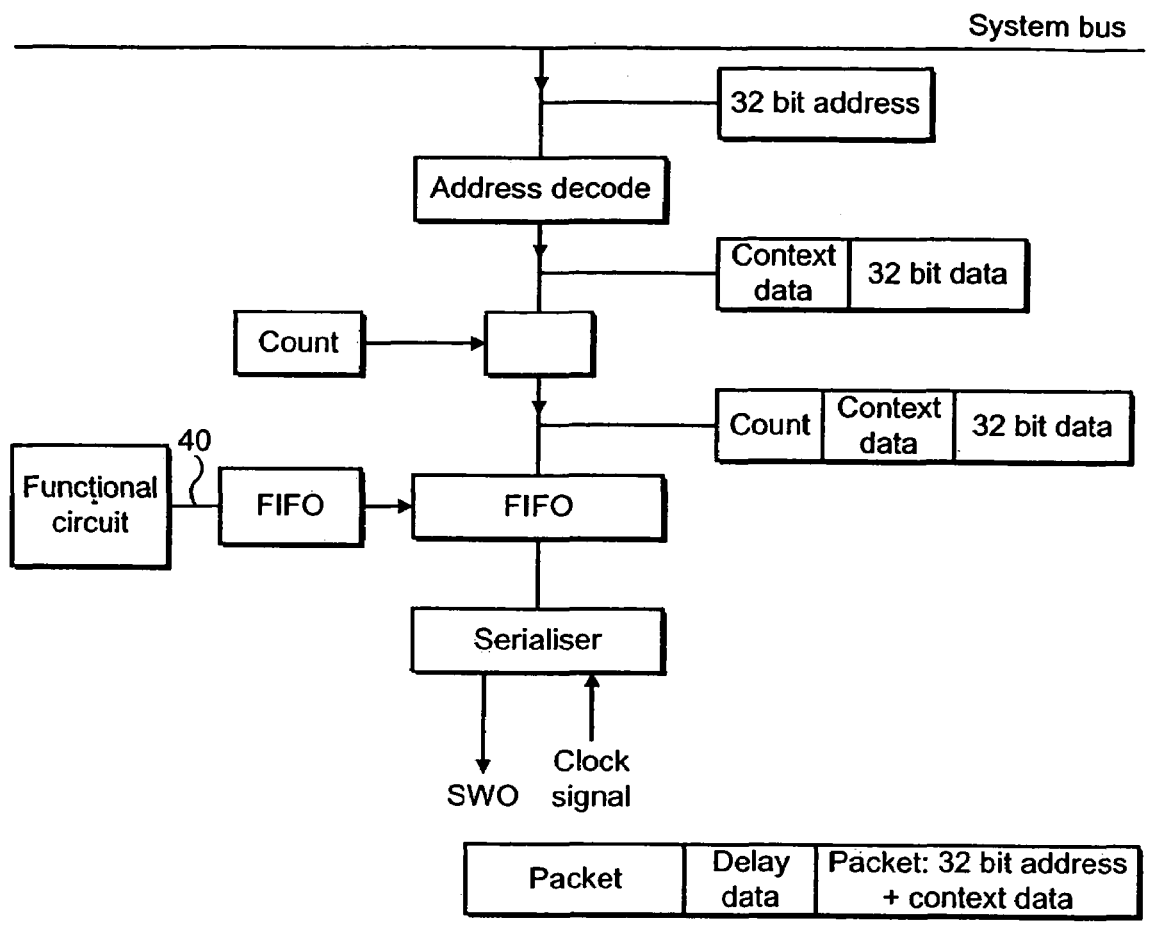
FIG. 2 schematically illustrates an integrated circuit comprising a diagnostic data capture circuit comprising a count data input and a hardware output according to an embodiment of the present invention.

FIG. 2 shows a data capture device for use in an integrated circuit according to an embodiment of the present invention. The data capture device is similar to that illustrated in FIG. 1, but additionally comprises a "count" input and an additional FIFO with an associated dedicated diagnostic bus for transmitting diagnostic data from a functional circuit.

The count input is operable to input a timing field indicative of a time value associated with the context data that can be attached to the 37-bit word. The count value is indicative of the length of time between data words being captured from the system bus, or in other words the length of time that such a word spends in the FIFO before the arrival of the next word.

One implementation is the provision of a counter that is started by the capture of a piece of data and is stopped by the capture of the next piece and is then restarted. If the capture timer overflows it sends a piece of data to this effect to the SWO, this does not effect bandwidth as these extra packets are only needed when there is, in effect, a pause in the packet train being output.

The information from the counter is added to the 37-bit word in the serialiser that is producing packets of data as a delay marker associated with the packet. In preferred embodiments this is 3-bits wide. The count data provides an indication of the time between the write instructions being performed by the processor and thus, is useful additional diagnostic data. It also can provide an indication if data capture of a particular data field is missed.

FIG. 2 also shows a dedicated diagnostic bus 40 which provides communication from a functional circuit to the diagnostic capture circuit output without data passing through a system bus. It is a hardware implementation and in effect can provide a "trace" of the operation of that particular functional circuit. There is no address decode here, the hardware being set up to directly write the data bits to a FIFO. It is coupled to the data capture circuit via its own FIFO this allows data to be added to the output line even if data is being captured from the system bus.

Figure 3:
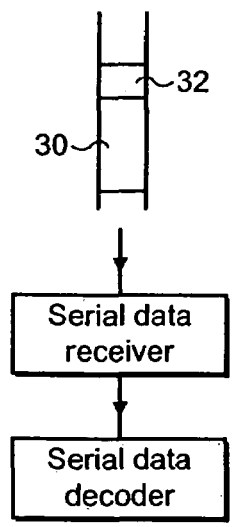
FIG. 3 shows a device for receiving data output by a diagnostic capture device having a single wire output according to an embodiment of the present invention.

FIG. 3 shows a device for receiving serial data output by a diagnostic capture device having a single wire output. The device comprises a serial data receiver and a serial data decoder. The receiver being operable to receive the serial signal and the decoder being operable to decode the signal and identify from within the signal, data words generated by the functional circuits and their related context data. The context data is then used to sort the data words and demultiplex the single stream into multiple streams.

In some embodiments the receiver can be a debugger on a host, the decoder acting to sort the data words according to their context data and forward the appropriate data to the debugger, while sending other data to custom DLLs and yet other data to store.

In addition to use for debugging or trace purposes other diagnostic data can be captured using this single wire output device. For example, if this system were present in an integrated circuit on an automobile, it would be possible to extract diagnostic data from this pin, the diagnostic data providing information on the condition of various parts of the automobile system.

Additional information on embodiments of the present invention is given below. In this respect the following terms and abbreviations are used.

| Term | Meaning |
| --- | --- |
| SWJ | Single Wire JTAG. This is a model whereby a run-control emulator is placed in the chip and communicated with using a single pin scheme (vs. the 4 or 5 for JTAG). This not only reduces pins, but generally is much faster than JTAG. It also provides additional access and a unique ID. The use of this MemTAP model allows this mode to run very fast for download. |
| DBT/Mem | This is a TAP block which acts as an AMBA (AHB or AHB-Lite) |
| TAP | master for access to a system bus. |
| AMBA | The ARM Bus standard within a chip. |

-continued

| Term | Meaning |
|---|---|
| AHB | The AMBA high-speed interface for normal memory accesses (vs. APB). |
| AHB Slave | An AMBA device, which actively responds to accesses at an address range. SWO is an AHB Slave device. |
| AHB Lite | Refers to a stripped down version of AMBA AHB without multi-master and without full burst mode and its associated signalling. |
| UART | An asynchronous serial (bits are sent one at a time) device. SWO is based on the notions of a UART. SWO is also intended to replace a UART as a debug trace tool. |
| ETM | Embedded trace macrocell refers to an on-chip trace block which response to trigger events and stores instruction and/or data trace information. |

Below is described a very small single-wire output "trace" component according to embodiments of the present invention. This component is quite different from ETM and can in fact be complementary with ETM (depending on the application and HW). The model for SWO is an application driven trace, whereas ETM is a processor driven trace. Where ETM uses triggers and ranges to control what to trace, SWO is passive and only outputs what was explicitly sent to it by the application, RTOS, or system HW.

SWO is designed to be used by applications for 4 main purposes:

To do 'printf' debugging. This means they want to have the app send data up some channel so they can post-process on the host. Traditionally a serial channel is used, but this requires one of the apps own resources (usually). It also means an ISR to drain (or HW auto buffering). Also, the much slower rates of traditional serial devices limits the data rate.

To do RTOS event tracing. This means that with small modifications to the RTOS, it writes an ID to a specific location, which indicates what event happened. As long as that write operation is cheap, it can leave the write in the deployed version (vs. having a separate debug image). This insures a fixed low intrusion to avoid creating a probe effect. Traditionally this is passed to a low priority thread, which pushes it out a serial line. Or, it is dumped to a ring buffer for post mortem analysis. But, most RTOSes only include that in special versions and the delay of the thread and serial line means that critical information is often lost or skewed. Further, the overhead of the thread and the much higher overhead of passing the information have a probe effect which can change the behaviour under test.

To do application or 'bus' tracing. This usually means to watch for specific transactions or real data. This is distinguished from printf debugging in that its interpretation must be de-coupled from the data itself (a priori knowledge for example). This also means that other cores in the system can use the same services (such as a DSP).

To allow System level HW to emit information collected. This allows the system designer to easily add small block information feeds under the control of the host. This can include contention analysis (bus use balancing, DMA analysis, PC sampling (in cache-less cores or with core support), event counting, time trigger events (such as from ETM), error conditions, etc.

In mixed SWO and ETM systems, ETM will be able to focus on instruction streams, special triggering events, and other areas where bandwidth is not compromised. This balancing provides a better solution for designers who are tight on pins and gates.

The SWO model leaves the modified application code as it is and simply shuts off the SWO component when not in use. This means that the time cost does not change between debug and production uses. So, it is fixed intrusion (usually very low since it just writes to fast memory). But, because it can be shut off, it does not draw power when not used.

The SWO architecture is based on three guiding principles:
1. Replaces debug-UART (RS232, etc) style programming solutions.
2. Can work well with a single pin at speeds up to 12 Mbit/s and with 2 pins at speeds up to 100 Mbit/s.
3. Minimises application intrusion.

The SWO interface is exposed as a set of 32 memory mapped word "registers". Each word register can be written to with a 32-bit value meaningful to the application. The index of the register (0–31) is part of the message. That is, there are not really 32 registers, but one register that is 37 bits wide. This 37-bit register contains the 32 bit data written by the application and the 5-bit index selected by the register addressed (bottom 5 bits of the address). This means that an application can add meaning to the data simply by the location selected.

In a typical model of an RTOS for example, index 0 could be used for thread-in, 1 for thread-out, 2 for mutex pend, 3 for queue pend, etc. This means, for example, that the RTOS only writes the thread ID (TCB address or other 32-bit info) into index 0 to indicate that the specified thread was dispatched in. So, in one store instruction, the RTOS can convey both what action/event occurred and the context of that action/event.

Indexes may be assigned in bands. So, 0–17 may be given to the RTOS (18 indexes), 18 and 19 for "printf" logging, 20 and 21 for function entry/exit (compiler generated or hand generated), 22 and 23 for ISR entry/exit, etc. Since the host also sees the 37 bits as "address" (5 -bits) and "data" (32-bits), it can de-multiplex this into different streams. So, on the host, the debugger can process all addresses 0–17 as RTOS events, 18 and 19 for printf logging, etc. This de-multiplexing is simply a configuration decision provided to the debugger and a convention used on the target. This allows some of the message streams to go to custom DLLs, some stored to file, and some processed live by the debugger. Any combination would be allowed.

Along with the 32 registers for data, the SWO component provides a key-locked control register, status register, and ID. There is also a mask-enable register, which allows selective disable of specific addresses (0–31).

SWO is defined to have two basic forms: the low-speed and the high-speed. The low-speed component is intended to sustain up to 12 Mbit/s on a single pin interface. The high-speed component is intended to sustain up to 100 Mbit/s on 2 wires (clock plus data). The high-speed component is still called "Single Wire" because it can do so using a single data pin. It should be noted that the high-speed component is expected to normally run around 48 MHz and less to work well with USB2 capture devices. Note that more pins could be used, but the intent is to keep the number of configurations very small to avoid problems with availability of capture devices.

With respect to protocol, the SWO component divides the overall problem into 4 layers of communication:
1. The wire protocol. This is defined as a 42-bit protocol for the normal single wire model (low-speed), but double clocked using Manchester encoding (so a 10 MHz bit rate uses a 20 MHz clock rate). It may be a wrapped ETM v3 packet when sharing pin resources. For high speed, it will be a 42-bit protocol with a separate clock source (could be a clock going into or out of the chip, intended for SWO or not).

2. The target protocol. This is defined as a 40-bit protocol, which contains a 3-bit header, a 5-bit address, and a 32-bit data block. The 3-bit header is used for delay information, overrun status, and extension formatting.

3. The data protocol. The data protocol is a contract between the host and target application. That is, there is no defined meaning to the 32-bit data. The meaning is assigned by the sender and decoded by host SW that is configured to understand it. This allows free-form use across a wide range of applications and systems.

4. The Capture device protocol. This is an extension of the target protocol and allows the capture device to provide additional information. In particular, the capture device provides time measures for packet starts (in micro-second granularity). Time measures allow relative and absolute time measures to be performed with reasonable accuracy. The internal delays in the target protocol are for packet "trains" (when packets are streamed out back-to-back), whereas the capture device times are fixed measures (and since measured at start of new packet or packet train, allows for corrections).

The Single Wire low-speed HW interface is designed to allow auto-bauding by low cost devices. By staying at or below 12 Mbit/second and by using Manchester encoding (1=HIGH–LOW, 0=LOW–HIGH), it is easy for a low cost device to auto-baud and works well with USB 1.1. Further, at 24 MHz and below, very little strain is put on the chip to drive the signals or the board designer to layout the traces. This helps to insure that this debug component can be used in-field requiring little real estate. In fact, in preferred embodiments the single wire will be multiplexed with a test pin in the chip (controlled at reset time) since there is no external HW interference (as would be common with trying to share with a GPIO tied to an LED for example). This means that the test pin connector can be used for SWO as well.

For high speed uses, a separate clock pin will be used (so Single data wire, plus a clock). This clock will be used for the rate, so no auto-bauding is needed (a start bit and parity will still be used to recognise a packet). Note that the clock may be any clock signal into or out of the chip. Also, note that a higher speed SWJ can use the same clock to allow very fast single wire debug control. This means that 3 pins can be used for SWJ+SWO at high speeds in larger devices. High speed SWJ with MemTAP will be able to operate faster than 4–6 wire JTAG today.

Although a 12 Mbit/s sustained rate is enough for most applications, the burst rate may need to be higher. The SWO component uses a FIFO to allow higher burst rates. The system designer can choose the depth of the FIFO (1 or more). The FIFO allows the application to send multiple words of data close together, as long as the overall rate is below the bandwidth. This can allow dumping 3 words of context for a rare event log for example. It is likely that a FIFO depth of 3 would be about optimal.

Note that the application still needs to have a sense of what the maximum rate will be for a particular processor. This will be affected by FIFO depth, clock rate of the core, and SWO rate. Since SWO does record that an overrun has occurred (data dropped), this allows tuning it for the particular application and chip combination easily.

The traditional model for printf debugging is to insert print statements into an application at strategic points. This allows a very application centric dump of information without stopping the processor. This technique is widely used for 4 reasons:

1. Stopping in a debugger at each point is time consuming, when you do not know what you are looking for, it is very time consuming. The printf model allows you to display important data and look for signs of problems. Printf debugging is used in conjunction with run-stop debugging, since once a problem area is narrowed down, one can then use the debugger to step through the problem area.

2. Analysis of code flow. The log can be used to watch the order of execution. This can be very useful for interrupt based SW, since the order of execution is not deterministic in most cases.

3. Data logging. The ability to dump values out while running allows analysis after the fact. If this were done using breakpoints, it would not only be time consuming, but would likely change the behaviour, since stopping will impact the external system. Typical uses are to compare actual data against expected (generated, previous application, specification, etc) and for tuning.

4. Rare event monitoring. The printf model is often used in systems where faults occur very rarely (say after 2 weeks of running). This can be used to capture as much information on the context at the point of detected failure.

The problem with traditional printf debugging is that it involves sending byte streams, often with data formatted into it, across a slow channel. Further, managing the results are then often difficult. Using strings has the following problems:

The longer the string, the longer it takes to send. This means that strings have to be terse which impacts the ability to read the results.

Strings have to be stored in target memory and so take space.

Strings often need to have data (local information) formatted into them. This not only takes time, but also means buffer management (until the formatted result string is out).

The alternative to the traditional is not using strings, but sending raw data. This then becomes difficult to convert to useful information, and creates issues about how the data is captured.

SWO according to an embodiment of the present invention supports a powerful kind of printf debugging in an efficient and easy to use manner. The model is based on two parts:

A string table model. This means that the user creates a file with a mapping between each string they want to use and a number and an enumeration name. For example:

0x10: DBG_CHANGE_VALVE: Valve position has changed to % d

0x11: DBG_MOTOR_SENSOR: Motor sensor reading: % u speed, % u temp, % u current.

In the above two lines, the file has provided enough information to allow each printf log to be sent in 32-bits. The 32-bit values will be "cracked" into an 8-bit index into the table (x10 and 0x11 would be in the 8 bit position) and 24-bit data value. In the $1^{st}$ string, the 24-bit value is used for the % d. In the $2^{nd}$ example, the 24 bit value is divided into 3 8-bit quantities and used for the % u controls. The strings can also use % c and fixed-point values. The file is consumed by a utility that creates a C/C++ header file, which defines each enumeration along with some macros to pack up the data.

This allows a very simple line in the program such as: DBG_STR_1(DBG_CHANGE_VALVE, valve position);

The macro simply writes the enumeration shifted 24-bits (a constant computed by the compiler) or'ed with the value provided. This uses very little processor overhead.

The debugger interprets the values coming in by looking up the 8-bit index in the string table, and then presents them in a log window and/or file. The log window allows filtering by enumeration and sorting. Both the log window and file also record the time stamp (from the capture device). This allows relative time measures between events.

In the past people have tried to use DCC for these same applications. However, doing this presents 3 main problems:

It is very non-deterministic in performance. It is only drained as fast as the JTAG emulator and SW choose to. When running a host based emulator, this is very unpredictable. This means that the application either has to lose the data (and there is then no record of this) or wait (blocking the application). This can be overcome somewhat by having a thread perform this operation (so only the thread is blocked) and/or use interrupt on empty. Both solutions still require quite a bit of intrusion.

Because it requires the CP14 interface and because of the single word problem defined above, it can not be written inline reasonably. This means that the application has to call out to routines to perform the actions needed—this adds considerable overhead.

There is no tool support to speak of (DCC channel viewer is the only real option for 'non-blocking' support).

So, DCC is about equivalent to using a UART, but with less deterministic performance. Also, the maximum DCC rate is heavily impacted by the emulator used and the SW used with it.

The capture device does time measurements. Determining the time of the 1st bit out of a new packet allows measurements to be made. The capture device emits a packet (to the host) just before, which indicates how much delay before this packet (from the last time packet). Once a packet train arrives (a packet train means that the start bit of the next packet is just after the stop of the previous—this is usually from FIFO unloading), the delay markers in the packets are used. The delay values indicate roughly how long the previous value was in the FIFO when the new one arrived. The delay is a power of 2 exponent of time (0=0–7, 1=8–15, 2=16–31, etc), so can be calibrated to provide a reasonable measurement.

Additionally, markers can be passed to SWO from ETM to allow correlation analysis. This could be correlated to trace events with user set-up (so write a value at the start of a trace block to get time correlation and then stamp all subsequent output). This then allows cycle-to-time relationships to be stored). This use of moderate resolution time (1 microsecond) coupled to ETM will allow better understanding of trace in the context of the application. This will become more true as ETM loses its ability to provide time stamping (other than cycles, which are not time correlated and can change their meaning at any time).

The time stamping allows measurements of stimulation/response, point-to-point in an application, HW event to SW response (such as ISR), ISR timings, interrupt latency, and code profiling. The normal time measures work by having the capture device insert packets back to the host as the capture timer overflows. This allows the host to get absolute times. Since these extra packets are only used when there is not a packet train, there is no bandwidth cost (since dead time on the capture-to-host communication link).

Four kinds of capture devices according to embodiments of the present invention are outlined below:

1. A low cost direct-to-USB de-serializer for low-speed SWO. This device carries no memory, but uses an EPLD and a USB device to send back the packets as is (except for time stamps). This device only needs two connectors on the target (SWO and Ground). It is particularly suited to micro-controllers.
2. A high speed capture device for high-speed SWO. This uses the additional separate clock pin to collect the data up to 100 MHz (or so). It either uses a higher speed communication channel to the host, such as USB2 or 100 Base10, or it uses on-board buffering if needed.
3. An ETM trace collection box. This collects the high speed SWO signals as is, or en-packeted in ETM v3 data streams.
4. An intelligent emulator such as RVI can be used to collect low speed SWO using an extra pin. This allows collection into local memory and then offload to host via RV-msg. It is unlikely that the RVI box would need to pre-process the data (other than timestamps).

Figure 4:
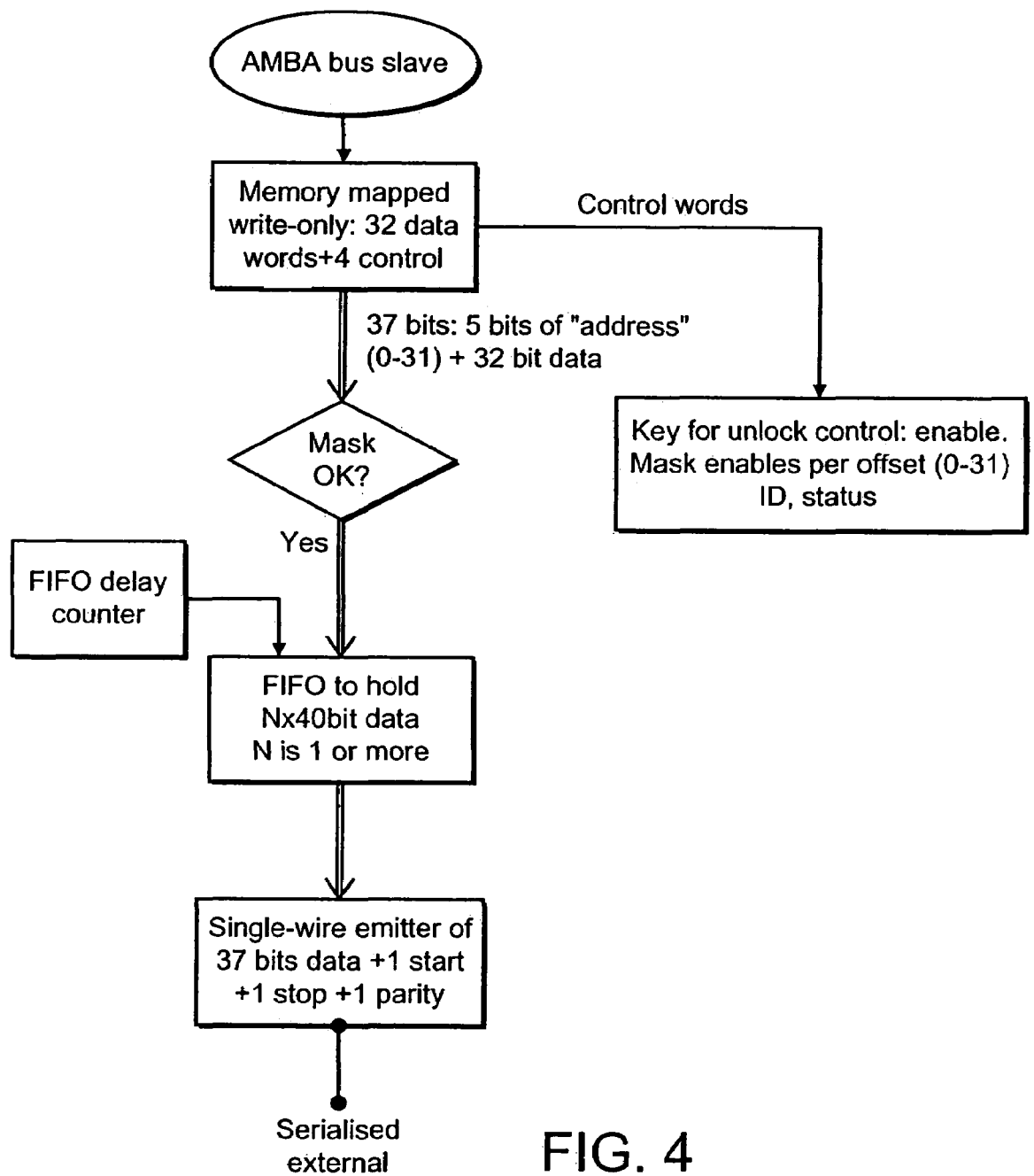
FIG. 4 a logical model of a single wire output interface according to an embodiment of the present invention.

As can be seen in FIG. 4, the logical design is that the core sees 32 words in internal "memory". These should be 0 or low wait state (effective 0 with write buffer). This allows an application to write to offsets 0–31 within the mapped area with a 32-bit data word. The device will record the 'modulo' address (as ((addr-base)>>2) & 0x1F) plus the 32 bit word. The extra mapped registers are for control and status.

The SWO component is disabled on power up to avoid waste of power (but it can still be written to, there will simply be no effect). Note that for passive use (no run control box), the application enables it in boot code or based on some detection mechanism (such as strap pin or boot EEPROM/Flash setting). This means that either the SWO is enabled by a run control emulator (through a core or MemTAP), or the application enables it itself.

Figure 5:
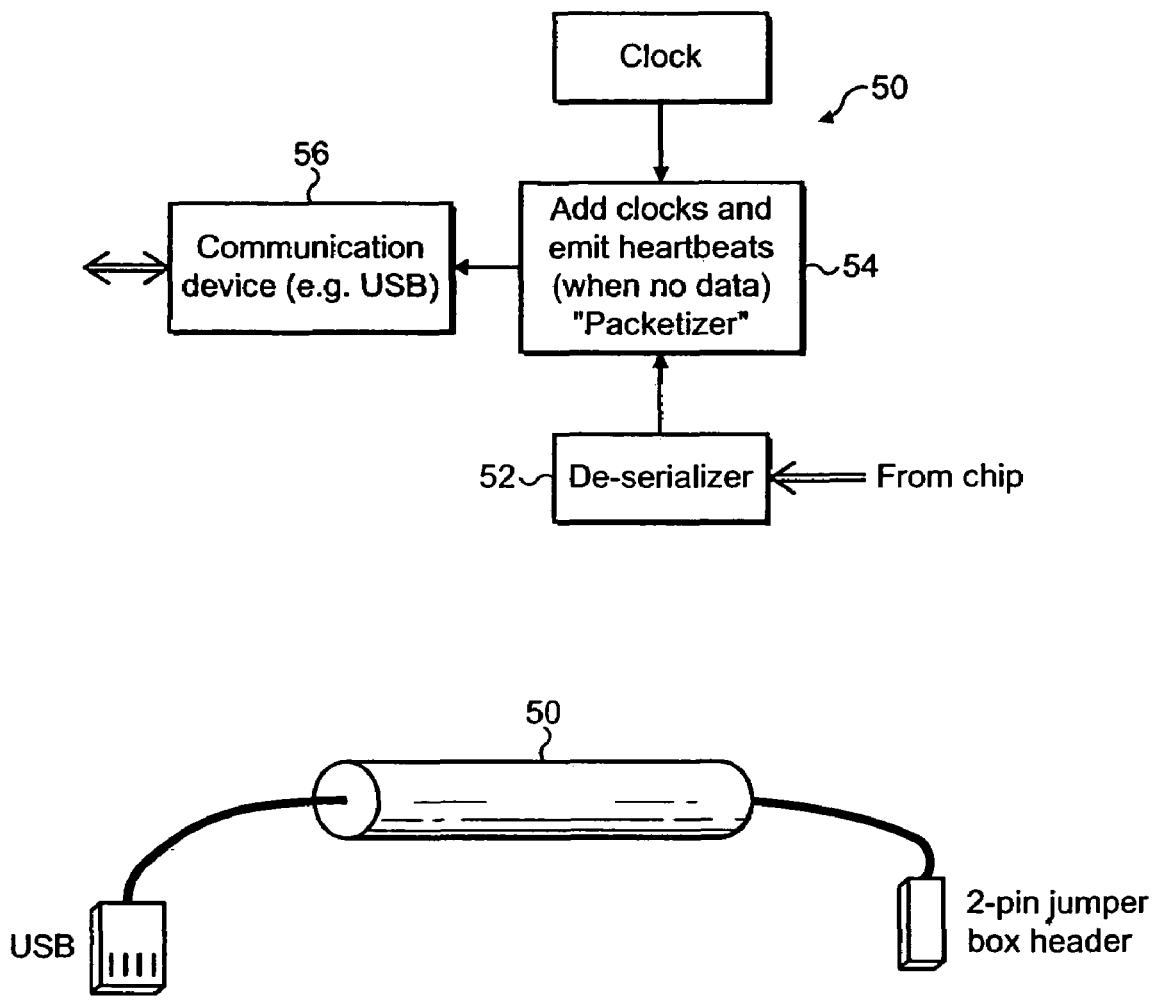
FIG. 5 schematically illustrates a diagnostic data capture device.

FIG. 5 schematically illustrates a diagnostic data capture device which may be connected to the integrated circuit. The external form of this appears as a cylinder containing circuitry with a cable plugged into a PCB connector at one end and with a computer connection, such as a USB plug, at the other end. Within the data capture circuitry 50, a deserializer receives a serial diagnostic data stream from an integrated circuit. A packetizer takes the byte stream from the deserializer 52 and adds its own clocking and also sends out heartbeats when no data for a certain period. It will also emit a packet to indicate if it overflowed (data arrived faster than the comms can drain it). Note that the heartbeat in a preferred implementation will always be sent every fixed period no matter what. This insures that there is no skew over time when long data trains arrive (re-baseline the time for the packet with the heartbeat). A communication device 56 (USB) takes the diagnostic data from the packetiser 54 and sends this to a general purpose computer (e.g. PC) for further analysis.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit, said integrated circuit comprising:
   at least one functional circuit operable to perform data processing operations;
   a diagnostic data capture circuit for capturing from a bus a diagnostic data field of values comprising a data word generated by said at least one functional circuit and a context word representing a context of said at least one functional circuit associated with said data word, said diagnostic data capture circuit comprises a bus slave having at least one memory mapped address;
   a diagnostic data serial output circuit operable to serialise said diagnostic data field and output said diagnostic data field from said integrated circuit to an external diagnostic device; and
   a program instruction executing on one of said at least one functional circuit generates said diagnostic data field, wherein said program instruction generates a bus transaction to one of said at least one memory mapped addresses on said bus from which said data word and said context word are captured.

2. The integrated circuit as claimed in claim 1, wherein said at least one functional circuit comprises a plurality of functional circuits, said bus being a functional bus interconnecting said plurality of functional circuits.

3. The integrated circuit as claimed in claim 2, wherein said functional bus includes a data portion and an address portion, said data word being captured from said data portion and said context word being captured from said address portion.

4. The integrated circuit as claimed in claim 3, wherein said context word is a part of an address on said address portion of said bus.

5. The integrated circuit as claimed in claim 3, comprising a plurality of buses including at least one bus comprising a dedicated diagnostic bus passing signals for said data word and said context word from one of said at least one functional circuit to said diagnostic data capture circuit.

6. The integrated circuit as claimed in claim 1, wherein said bus is a dedicated diagnostic bus passing signals for said data word and said context word from said at least one functional circuit to said diagnostic data capture circuit.

7. The integrated circuit as claimed in claims 1, wherein said diagnostic data capture circuit includes a first in first out buffer into which diagnostic data fields are stored before being serialised for output by said diagnostic data serial output circuit.

8. The integrated circuit as claimed in claim 1, wherein said diagnostic data field also includes a timing word indicative of a time value associated with said diagnostic data word.

9. The integrated circuit as claimed in claim 8, wherein said time value is a count value indicative of a time duration since capture of any previously captured diagnostic data field still being output by said diagnostic data serial output circuit.

10. The integrated circuit as claimed in claim 9, wherein said time value also serves to indicate if at least one of said diagnostic data fields have failed to be captured by said diagnostic data capture circuit.

11. The integrated circuit as claimed in claim 1, wherein said diagnostic data serial output circuit outputs said diagnostic word on a single diagnostic data serial output signal line.

12. The integrated circuit as claimed in claim 1, wherein said diagnostic data serial output circuit outputs said diagnostic word on a single diagnostic data serial output signal line in association with a clock signal on a clock signal line.

13. The integrated circuit as claimed in claim 1, wherein said diagnostic data capture circuit is operable to capture a bus transaction on said bus associated with an address matching a predetermined address characteristic.

14. The integrated circuit as claimed in claim 13, wherein said predetermined characteristic is that said address falls within predetermined range of addresses.

15. The integrated circuit as claimed in claim 14, wherein said context word is an index value indicative of a position of said address within said predetermined range of addresses.

16. The integrated circuit as claimed in claim 1, wherein said diagnostic data capture circuit includes a mask circuit using a programmable mask value to select diagnostic data fields to be captured.

17. A diagnostic device for receiving diagnostic data from an integrated circuit, said diagnostic device comprising:
   a diagnostic data serial data receiver for receiving serial data representing a diagnostic field of values captured from a bus within said integrated circuit; and
   a diagnostic data decoder for decoding said diagnostic field to identify therein a data word generated upon said bus by at least one functional circuit within said integrated circuit and a context word representing a context of said at least one functional circuit associated with said data word.

18. The diagnostic device as claimed in claim 17, wherein said bus is a functional bus connecting a plurality of functional circuit, said functional bus including a data portion and an address portion, said data word being captured from said data portion and said context word being captured from said address portion.

19. The diagnostic device as claimed in claim 18, wherein said context word is a part of an address on said address portion of said bus.

20. The diagnostic device as claimed in claim 18, wherein diagnostic data fields are captured from a plurality of buses, at least one bus being a dedicated diagnostic bus passing signals for said data word and said context word.

21. The diagnostic device as claimed in claim 17, wherein said bus is a dedicated diagnostic bus passing signals for said data word and said context word.

22. The diagnostic device as claimed in claim 17, wherein said diagnostic data field also includes a timing word indicative of a time value associated with said diagnostic data word.

23. The diagnostic device as claimed in claim 22, wherein said time value is a count value indicative of a time duration since capture of any previously captured diagnostic data field still being output from said integrated circuit.

24. The diagnostic device as claimed in claim 23, wherein said time value also serves to indicate if one or more diagnostic data fields have failed to be captured within said integrated circuit.

25. The diagnostic device as claimed in claim 17, wherein said diagnostic data serial data receiver receives said diagnostic word on a single diagnostic data serial input signal line.

26. The diagnostic device as claimed in claim 17, wherein said diagnostic data serial data receiver receives said diagnostic word on a single diagnostic data serial output signal line in association with a clock signal on a clock signal line.

27. The diagnostic device as claimed in claim 17, wherein said diagnostic data word is generated in response to a program instruction executing on at least one functional circuit of said integrated circuit.

28. The diagnostic device as claimed in claim 27, wherein said program instruction generates a bus transaction to said bus from which said data word and said context word are captured.

29. The diagnostic device as claimed in claim 17, wherein a diagnostic data field corresponds a bus transaction on said bus associated with an address matching a predetermined address characteristic.

30. The diagnostic device as claimed in claim 29, wherein said predetermined characteristic is that said address falls within predetermined range of addresses.

31. The diagnostic device as claimed in claim 30, wherein said context word is an index value indicative of a position of said address within said predetermined range of addresses.

32. The diagnostic device as claimed in claim 17, wherein said diagnostic data fields are selected for capture by a programmable mask value.

33. A method of generating diagnostic data representative of one or more data processing operations performed by one or more functional circuits of an integrated circuit, said method comprising:
capturing from a bus a diagnostic data field of values comprising a data word generated by said one or more functional circuits and a context word representing a context of said one or more functional circuits associated with said data word; and
serialising said diagnostic data field; and
outputting said diagnostic data field from said integrated circuit to an external diagnostic device.

34. The method as claimed in claim 33, wherein said integrated circuit includes a plurality of functional circuits, said bus being a functional bus interconnecting said plurality of functional circuits.

35. The method as claimed in claim 34, wherein said functional bus includes a data portion and an address portion, said data word being captured from said data portion and said context word being captured from said address portion.

36. The method as claimed in claim 35, wherein said context word is a part of an address on said address portion of said bus.

37. The method as claimed in claim 33, wherein said bus is a dedicated diagnostic bus passing signals for said data word and said context word from at least one functional circuit to said diagnostic data capture circuit.

38. The method as claimed in claim 35, wherein said integrated circuit comprise a plurality of buses including at least one bus being a dedicated diagnostic bus passing signals for said data word and said context word from at least one functional circuit to said diagnostic data capture circuit.

39. The method as claimed in claims 33, comprising buffering diagnostic data fields in a first in first out buffer before being serialising said diagnostic data fields.

40. The method as claimed in claim 33, wherein said diagnostic data field also includes a timing word indicative of a time value associated with said diagnostic data word.

41. The method as claimed in claim 40, wherein said time value is a count value indicative of a time duration since capture of any previously captured diagnostic data field still being output.

42. The method as claimed in claim 41, wherein said time value also serves to indicate if one or more diagnostic data fields have failed to be captured by said diagnostic data capture circuit.

43. The method as claimed in claim 33, wherein said diagnostic data field is output on a single diagnostic data serial output signal line.

44. The method as claimed in claim 33, wherein said diagnostic data field is output on a single diagnostic data serial output signal line in association with a clock signal on a clock signal line.

45. The method as claimed in claim 33, wherein a program instruction executing on at least one of said functional circuit generates of said diagnostic data field.

46. The method as claimed in claim 45, wherein said program instruction generates a bus transaction to said bus from which said data word and said context word are captured.

47. The method as claimed in claim 33, wherein a bus transaction on said bus associated with an address matching a predetermined address characteristic is captured.

48. The method as claimed in claim 47, wherein said predetermined characteristic is that said address falls within predetermined range of addresses.

49. The method as claimed in claim 48, wherein said context word is an index value indicative of a position of said address within said predetermined range of addresses.

50. The method as claimed in claim 33, wherein a programmable mask value is used to select diagnostic data fields to be captured.

* * * * *